United States Patent [19]
Jackson, Jr.

[11] Patent Number: 5,821,870
[45] Date of Patent: Oct. 13, 1998

[54] MONITORED SECURITY SWITCH ASSEMBLY

[76] Inventor: John T. Jackson, Jr., 316 California Ave., Suite 745, Reno, Nev. 89509

[21] Appl. No.: 845,866

[22] Filed: Apr. 28, 1997

Related U.S. Application Data

[60] Provisional application No. 60/030,988 Nov. 15, 1996, and provisional application No. 60/016,309 May 8, 1996, and provisional application No. 60/028,491 Oct. 15, 1996.

[51] Int. Cl.[6] .................................................. G08B 21/00
[52] U.S. Cl. ........................ 340/687; 340/541; 340/568; 340/571; 340/686
[58] Field of Search .................................. 340/541, 568, 340/571, 687, 652, 686

[56] References Cited

U.S. PATENT DOCUMENTS

| | | | |
|---|---|---|---|
| 3,696,378 | 10/1972 | Daniel | 340/572 |
| 3,750,125 | 7/1973 | Ross et al. | 340/561 |
| 3,766,540 | 10/1973 | Schopfer et al. | 340/505 |
| 4,091,367 | 5/1978 | Harman | 340/552 |
| 4,155,073 | 5/1979 | Ulch et al. | 371/20.4 |
| 4,630,228 | 12/1986 | Trrczy-Hornoch et al. | 364/576 |
| 4,658,242 | 4/1987 | Zeder | 340/568 |
| 4,680,574 | 7/1987 | Ruffner | 340/571 |
| 4,736,195 | 4/1988 | McMurtry et al. | 340/568 |
| 4,739,276 | 4/1988 | Graube | 324/534 |
| 5,448,222 | 9/1995 | Harman | 340/566 |
| 5,473,200 | 12/1995 | Woo | 307/10.2 |

FOREIGN PATENT DOCUMENTS

2632738 A  1/1978  Germany.

OTHER PUBLICATIONS

E.L. Fuss, "Modern Alarm Line Supervisory Techniques", *IEEE Transactions on Power Apparatus and Systems,* vol. 101, No. 9, Sep. 9, 1992, pp. 3222–3225.

M.E. Van Valkenburg, Network Analysis, Second Edition, pp. 386–390.

Algie L. Lance, Introduction to Microwave Theory and Measurement, 1964, pp. 25–29; 50–51.

*Primary Examiner*—Jeffery A. Hofsass
*Assistant Examiner*—Benjamin C. Lee
*Attorney, Agent, or Firm*—Morgan, Lewis & Bockius LLP

[57] ABSTRACT

A monitored security switch assembly includes a switching system, a transmission line, and a monitoring system. The switching system has a load element. The security switch assembly uses an oscillatory voltage to determine if the monitoring system, the switching system and the transmission line are impedance matched. The security switch system can function in a transmission mode or a reflection mode.

30 Claims, 9 Drawing Sheets

MONITORED SECURITY SWITCH ASSEMBLY

The present application invention claims the benefit of U.S. Provisional patent application Ser. No. 60/030,988 (Jackson) filed Nov. 15, 1996. U.S. Provisional application Ser. No. 60/016,309 (Jackson) filed May 8, 1996, and U.S. Provisional application Ser. No. 60/028,491 (Jackson) filed Oct. 15, 1996 are hereby incorporated by reference.

BACKGROUND OF THE INVENTION

1. Field of the Invention

The present invention relates to a monitoring system, and more particularly to a monitoring system for a proximity switch system.

2. Discussion of the Related Art

In many security applications, security switches, including high security switches, are connected by wires to a remote security monitoring system. These systems are vulnerable to defeat if access can be gained to the connecting wires. One method to defeat a wired security switch is to discover the appropriate pairs of wires and short them out, thereby bypassing the security switch and defeating the system. Armored cables and conduits are sometimes used to limit access to the connecting wires. However, these protective means do not actively monitor the integrity of the cables, nor do they provide any indication that such means have been breached. Hence, if access can be gained to the wires at any point, the system can be defeated.

U.S. Pat. No. 4,155,073 to Ulch et al. discloses one system that monitors line integrity between a central terminal and a remote terminal. In Ulch et al., the central terminal repeatedly issues a polling request to the remote terminal, and the remote terminal returns a coded polling response which is monitored and verified by the central terminal. However, this system requires complex processing.

U.S. Pat. No. 5,448,222 to Harman discloses a perimeter intrusions detection system that monitors impedance changes in a transducer cable. Since this system is directed toward monitoring a perimeter rather than a specific point of entry, Harman uses the impedance matching in place of switches. Moreover, this system is subject to false alarms if vibrations occur along any portion of the environment.

Because the conventional proximity switch systems suffer from the above-noted limitations and disadvantages, an improved design is needed.

SUMMARY OF THE INVENTION

Accordingly, the present invention is directed to a monitored security switch assembly that substantially obviates one or more of the problems due to limitations and disadvantages of the related art.

An object of the present invention is to provide a proximity switch system that can monitor the integrity of the system.

Another object of the present invention is to provide a proximity switch system that cannot be defeated.

Another object of the present invention is to provide a proximity system that can reliably and economically monitor a proximity switch system.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the monitored security switch assembly comprises a switching system including a load element; a transmission line, the load element being impedance matched with the transmission line; and a monitoring system which provides at least one oscillatory voltage to the switching system through the transmission line, the monitoring system detecting an impedance mismatch between the load element and the transmission line.

In another aspect, the monitored security switch assembly comprises a switching system including an oscillator, the oscillator providing at least one an oscillatory voltage; a transmission line; and a monitoring system which receives and detects the oscillatory voltage from the switching system through the transmission line, wherein the monitoring system is impedance matched with the transmission line, the monitoring system monitoring whether the monitoring system and the transmission line are impedance matched.

In another aspect, the monitoring system for a security switch assembly comprises an oscillator for providing an oscillatory voltage to a transmission line and a switching element having a load, the transmission line being impedance matched with each of the oscillator and a load of the switching element; and a mismatch detector connected to the transmission line and impedance matched with the transmission line, wherein the mismatch detects whether an impedance mismatch occurs.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DESCRIPTION OF THE PREFERRED EMBODIMENTS

Reference will now be made in detail to the preferred embodiments of the present invention, examples of which are illustrated in the accompanying drawings.

The proximity switch system of the present invention includes a stationary assembly, an actuator assembly moveable relative to the stationary assembly, and a radio frequency monitoring system to which the stationary assembly is connected by a coaxial cable or transmission line. The stationary assembly and the actuator assembly may be any magnetic proximity switch of the security or high security types, balanced or unbalanced. The security switches may include, but is not limited to, reed switch technology, the security switch technology referenced in the U.S. Provisional patent application Ser. No. 60/028491 which was filed by John T. Jackson, Jr. on Oct. 15, 1996, titled "Balanced Type Magnetically Actuated Proximity Switch System", hereafter referred to as the Jackson Switch system, or the types referenced in the U.S. Provisional patent application Ser. No. 60/016,309 (Jackson) filed on May 8, 1996 hereafter referred to as the Jackson Switch.

The security switches are modified to include either a matched electrical load, a matched radio frequency generator, or a matched radio frequency generator in combination with a band pass filter and matched to a transmission line which is also matched to monitoring circuits. The monitoring system monitors the integrity of the switch and its associated coaxial cable or transmission line. Further, either a transmission mode or a reflection mode may be used to monitor the integrity of the switch and the transmission line. An additional proximity switch, including reed switch technology, mechanical switches, or Jackson Switches, may be included as an anti-tamper switch for detecting the removal of the stationary element from the mounting surface. In this configuration, the anti-tamper switch is connected along with any security switch within the same housing and coupled to the coaxial cable or transmission line by such means that both the switches may use the same coaxial cable or transmission line without interference between the direct current voltages associated with each switch or the radio frequency signals. This also applies to any other combination of devices within the switch assembly that use direct current voltage and radio frequency signals jointly or separately. The radio frequency monitored magnetically actuated proximity switches are connected to a monitoring system by a coaxial cable or transmission line as part of an electronic physical security system or machinery control system for detecting and monitoring the opening or closing of panels, windows, doors or the like. The system will trigger an alarm state if any attempt is made to alter, modify, tamper, or interrupt the connecting coaxial cable or transmission line.

Figure 1A:
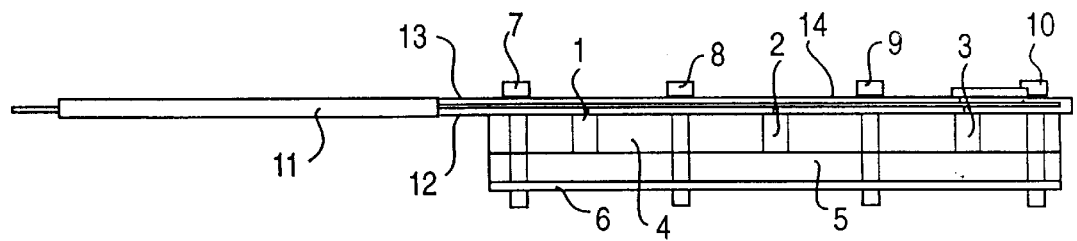
FIGS. 1A and 1B show a top view and a perspective exploded view, respectively, of a Jackson Switch system modified for radio frequency operation and its transmission line.
Figure 1B:
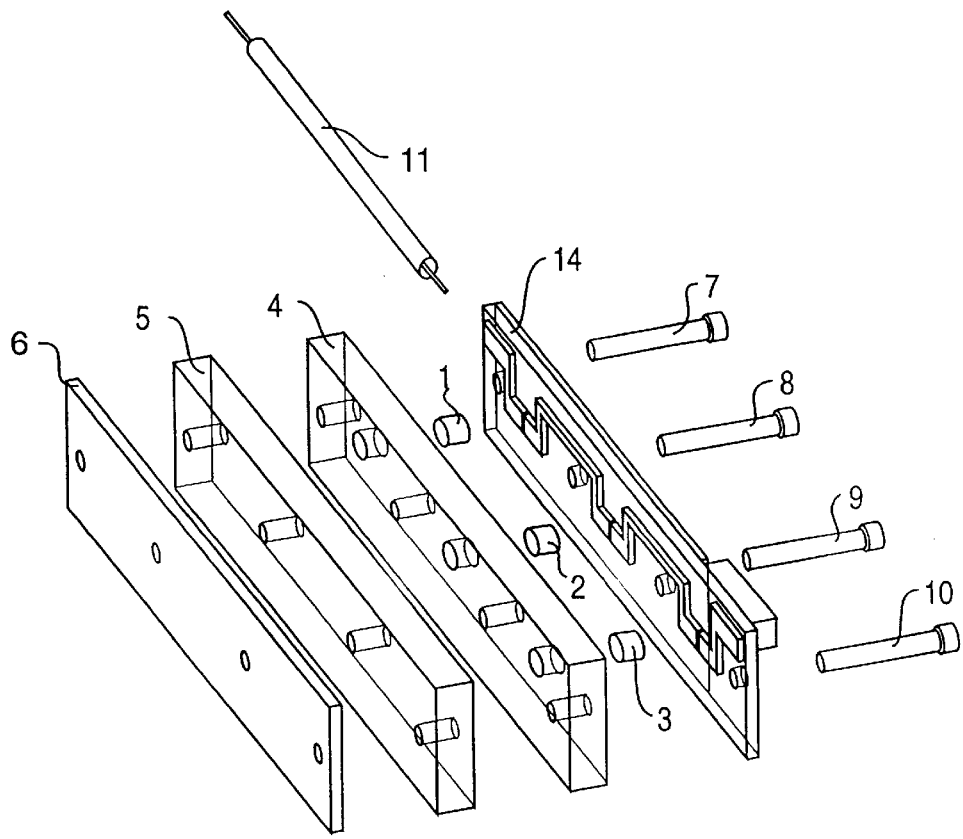

FIGS. 1A and 1B show a top view and a perspective view respectively, of a high security switch comprising three permanent armature magnets 1, 2, and 3. The permanent armature magnets are enclosed in a single integrated armature block 4 consisting of any suitable nonmagnetic dielectric material or insulator such as plastic, glass, or ceramic. The actuation gap of the switch is set by the thickness of the integrated spacer 5 consisting of any suitable nonmagnetic material such as plastic, glass, ceramic, or metal to which the permanent spring magnets are fastened.

Figure 2A:
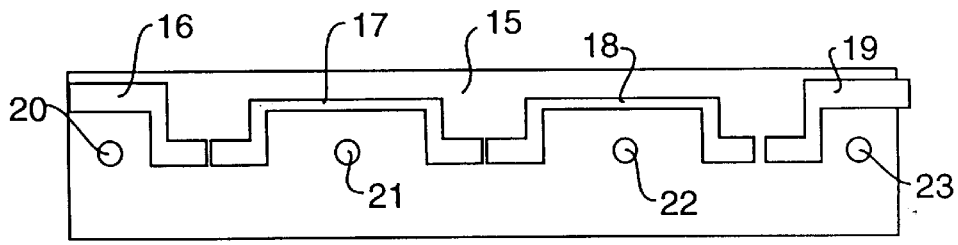
FIGS. 2A and 2B show a front view and a back view, respectively, of the circuit board in FIG. 1, modified for radio frequency operation.
Figure 2B:
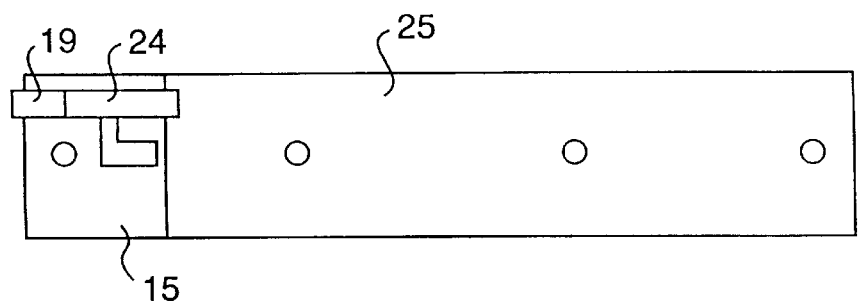
Figure 3:
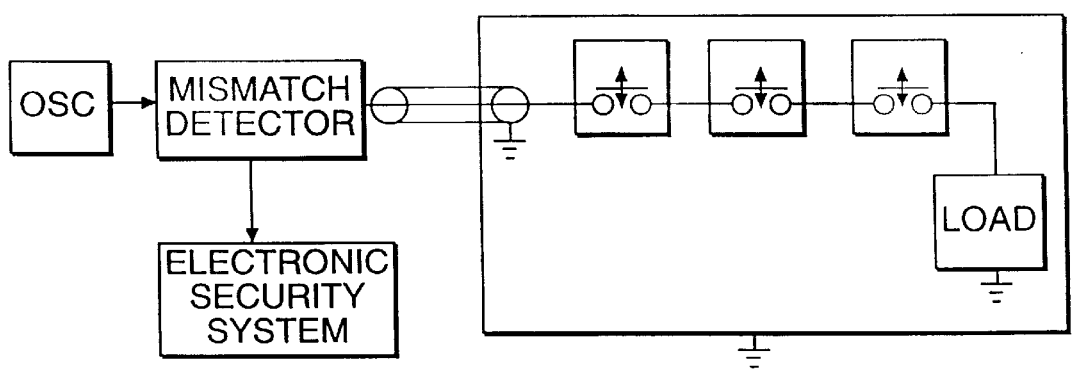
FIG. 3 shows a typical generalized electrical schematic of the Jackson Security Switch of FIGS. 1 and 2 in combination with a physical security monitoring system.

As shown in FIG. 2, the magnetically soft screws 7, 8, 9, and 10 extend through the printed circuit board 14, the armature block 4, and the spacer 5, and decouple the interactive fields between the permanent armature magnets 1, 2, and 3, which eliminate the detrimental effect of the interactive fields upon switching action. The magnetically soft plate or yoke 6, consisting of any magnetically soft material such as iron, acts as an integrated spring magnet, resulting in a more economical use of materials. A coaxial cable or transmission line 11 connects to the high security switch circuit board 14 such that the center conductor of the transmission connects to the trace 16 of the circuit board as shown in FIG. 2A, and the outer conductor or shield connects to the ground plane 25 of the circuit board as shown in FIG. 2B. This high security switch is wired, but not limited to, single pole single throw (SPST) as shown in FIG. 3. The entire assembly may be fastened together by any suitable means and in combination with appropriate materials may produce a hermetically sealed unit.

FIGS. 2A and 2B show a front view and a back view of the circuit board 14 in FIG. 1 respectively, the gaps in the three sets of traces between 16 and 17, 17 and 18, and 18 and 19, are shorted out by the armature magnets 1, 2, and 3 respectively when actuated by the actuator assembly. Trace 19 is shown wrapping around the edge of the circuit board substrate 15, which is made, for example, from epoxy glass, Teflon, ceramic, or other suitable material, to the back side where a load resistor 24, preferably 50Ω, designated as LOAD in FIG. 3, connects the trace to the ground plane 25. There are four holes 20, 21, 22, 23 through the circuit board substrate 15 to accommodate the magnetic field decouplers Referring to FIG. 3, one preferred embodiment of the invention is a security monitoring system comprising a radio frequency oscillator, designated OSC, which sends a radio frequency signal through the MISMATCH DETECTOR and down the transmission line. The radio frequency signal travels through the Jackson Switch system when actuated, shown by the three switch icons, and terminates in the LOAD. The electrically grounded box surrounding the switch assembly is an electrically conductive housing that is grounded to the transmission line's outer conductor. When the oscillator, MISMATCH DETECTOR, transmission line, Jackson Security Switch, and LOAD are substantially matched, there will be a minimal reflection of the radio frequency signal. The MISMATCH DETECTOR may be a VSWR (voltage standing wave ratio) circuit which reads a VSWR of 1.5:1 or better when the matched condition exists. If the transmission line is cut into or tampered with, the system will no longer be matched and will exhibit a VSWR of much greater than 1.5:1 which is communicated to the ELECTRONIC SECURITY SYSTEM as a fault. Alternatively, the combination of the oscillator and MISMATCH DETECTOR may be a network analyzer or any other suitable circuit. The MISMATCH DETECTOR, for example, may measure S-parameters, Z-parameters, Y-parameters, image impedance, or the like. These parameters are determined by some combination of reflected and transmitted waves.

Figure 4A:
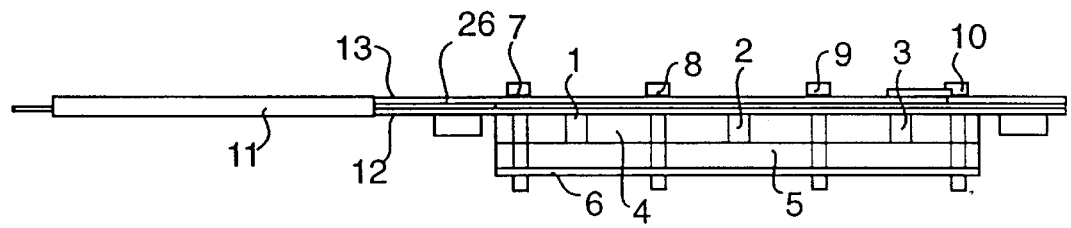
FIGS. 4A and 4B show a top view and a perspective exploded view, respectively, of another Jackson Switch system, modified for radio frequency operation and its transmission line.
Figure 4B:
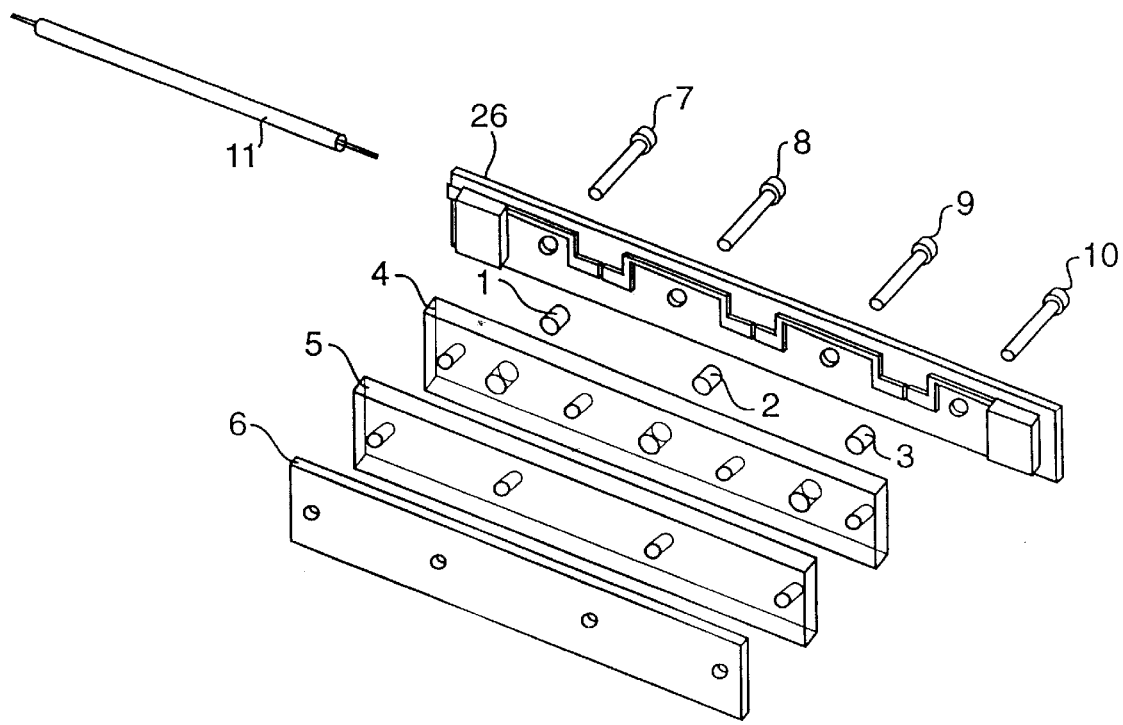
Figure 5A:
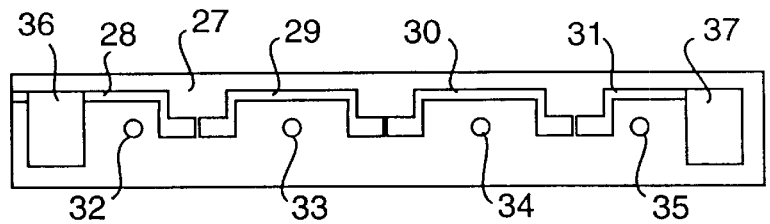
FIGS. 5A and 5B show a front view and a back view, respectively, of the circuit board in FIG. 4, modified for radio frequency operation.
Figure 5B:
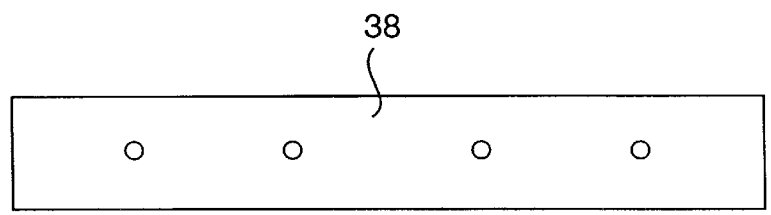
Figure 6:
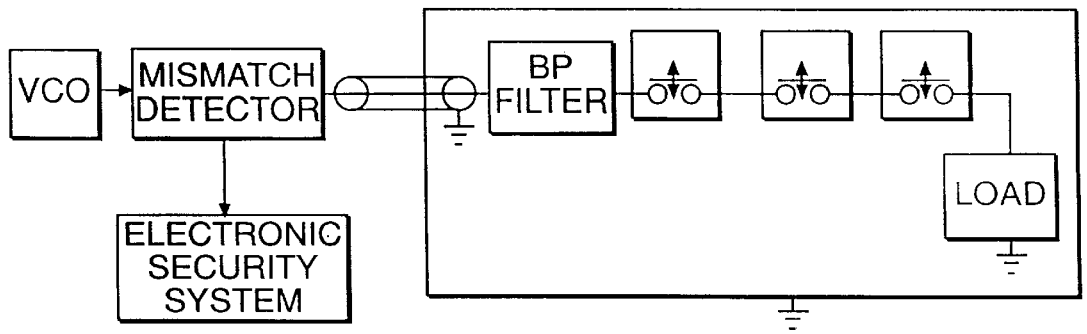
FIG. 6 shows another typical generalized electrical schematic of the Jackson Security Switch of FIGS. 4 and 5 in combination with a physical security monitoring system.

FIGS. 4A and 4B show a top view and a perspective view, respectively, of another high security switch, comprising three permanent armature magnets 1, 2, and 3. The permanent armature magnets are enclosed in a single integrated armature block 4 consisting of any suitable non-magnetic dielectric material or insulator such as plastic, glass, or ceramic. The actuation gap of the switch is set by the thickness of the integrated spacer 5 consisting of any suitable nonmagnetic material such as plastic, glass, ceramic, or metal to which the permanent spring magnets are fastened. The magnetically soft screws 7, 8, 9, and 10 extend through the printed circuit board 26, the armature block 4, and the spacer 5 to decouple the interactive fields between permanent armature magnets 1, 2, and 3, which eliminate the detrimental effect of the interactive fields upon switching action. The magnetically soft plate or yoke 6, consisting of any magnetically soft material such as iron, acts as an integrated spring magnet for a more economical use of materials. A coaxial cable or transmission line 11 is shown which connects to the high security switch circuit board 26 such that the center conductor of the transmission connects to the black box 36 of the circuit board as shown in FIG. 5A, and the outer conductor or shield connects to the ground plane 38 of the circuit board as shown in FIG. 5B. This high security switch is wired, but not limited to, single pole single throw (SPST) as shown in FIG. 6. The entire assembly may be fastened together by any suitable means and in combination with appropriate materials may produce a hermetically sealed unit.

Referring to FIG. 5A and 5B, a front view and a back view of the circuit board 26 in FIG. 4 respectively, the gaps in the three sets of traces 28 and 29, 29 and 30, and 30 and 31, are shorted out by the armature magnets 1, 2, and 3, respectively, when actuated by the actuator assembly. There are four holes 32, 33, 34, 35 through the circuit board substrate 27, made for example from epoxy glass, Teflon, ceramic, or other suitable material, to accommodate the magnetic field decouplers. The first black box 36 may be any electronic bandpass filter, designated as BP FILTER in FIG. 6, and the second black box 37 is the load, designated as LOAD in FIG. 6.

Referring to FIG. 6, a second preferred embodiment of the invention, comprising a radio frequency voltage controlled oscillator, designated VCO, that sends two or more distinct radio frequency signals through the MISMATCH DETECTOR and down the transmission line, is shown. At least one of the frequencies or spectral components must fall within the bandpass of the BP FILTER. The radio frequency signals travel through the Jackson Switch system when actuated, shown by the three switch icons, and terminate in the LOAD. The electrically grounded box surrounding the switch assembly is an electrically conductive housing grounded to the transmission line's outer conductor. When the oscillator, MISMATCH DETECTOR, transmission line, BP FILTER, Jackson Switch system, and LOAD are substantially matched, there will be minimal reflection of the radio frequency signal which is passed by the BP FILTER and no match at the other frequency or frequencies. The MISMATCH DETECTOR may be a VSWR (voltage standing wave ratio) circuit which reads a VSWR of 1.5:1 or better for the matched signal and much greater that 1.5:1 or all other frequencies. If the transmission line is cut into or tampered with, the system will no longer be matched and will exhibit a VSWR of much greater than 1.5:1 at the bandpass radio frequency, and will be communicated to the ELECTRONIC SECURITY SYSTEM as a fault. If the security switch is cut from the cable and a dummy resistive matched load is connected thereto, all radio frequencies will be matched which is also communicated to the ELECTRONIC SECURITY SYSTEM as a fault. Alternatively, the combination of the VCO and MISMATCH DETECTOR may be a network analyzer.

Figure 7A:
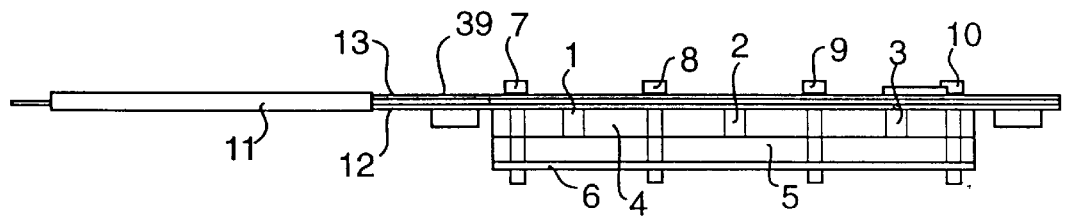
FIGS. 7A and 7B show a top view and a perspective exploded view, respectively, of another Jackson Switch system, modified for radio frequency operation and its transmission line.
Figure 7B:
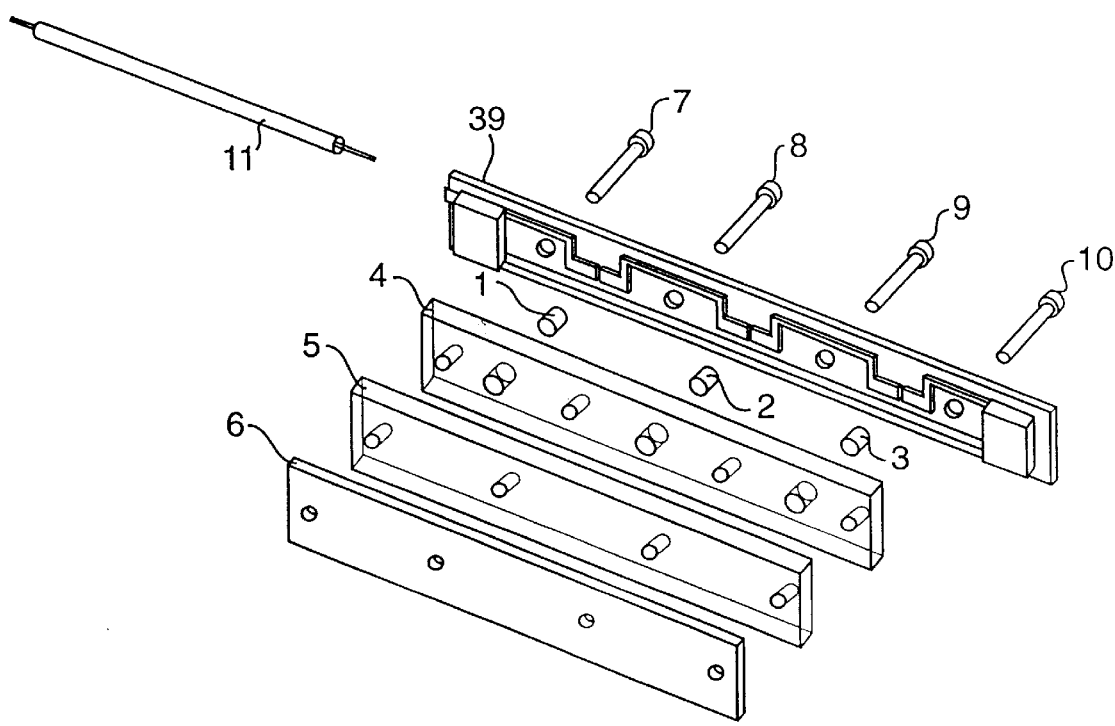
Figure 8A:
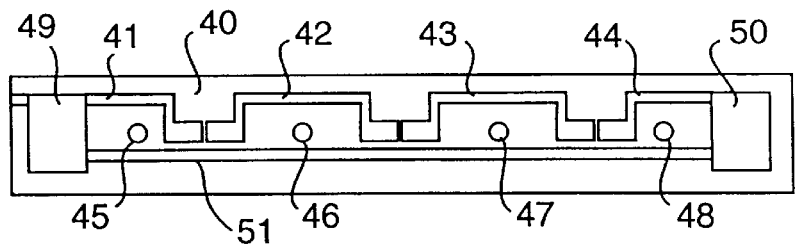
FIGS. 8A and 8B show a front view and a back view, respectively, of the circuit board in FIG. 7, modified for radio frequency operation.
Figure 8B:
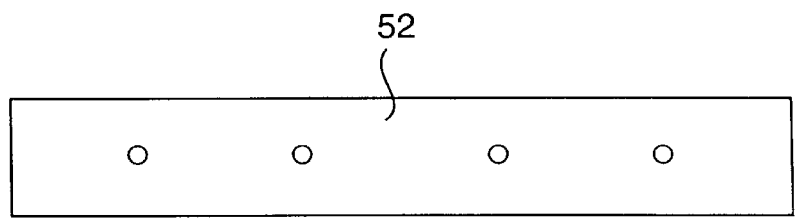
Figure 9:
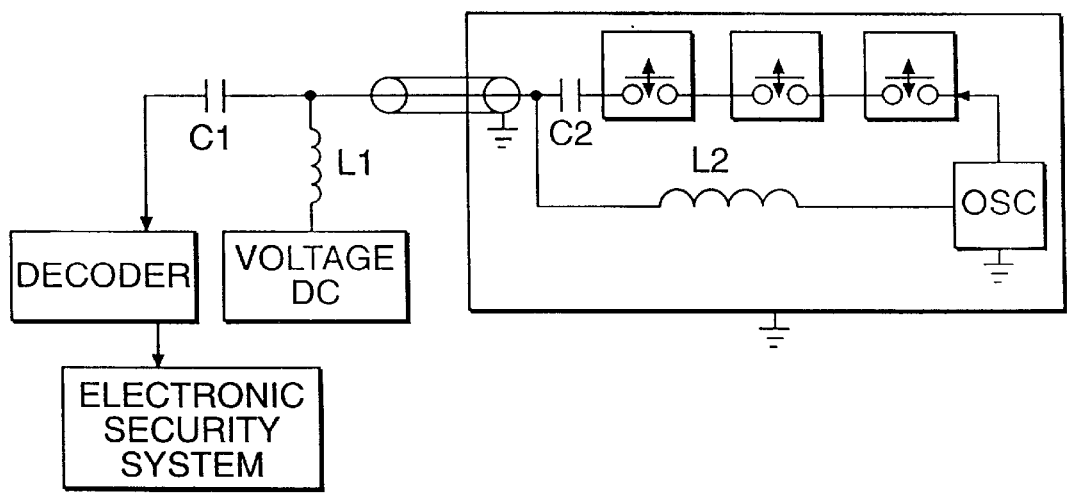
FIG. 9 shows another typical generalized electrical schematic of the Jackson Security Switch of FIGS. 7 and 8 in combination with a physical security monitoring system.

FIGS. 7A and 7B show a top view and a perspective view, respectively, of another high security switch comprising three permanent armature magnets 1, 2, and 3. The permanent armature magnets are enclosed in a single integrated armature block 4 consisting of any suitable non-magnetic dielectric material or insulator such as plastic, glass, or ceramic. The actuation gap of the switch is set by the thickness of the integrated spacer 5 consisting of any suitable non-magnetic material such as plastic, glass, ceramic, or metal to which the permanent spring magnets are fastened. The magnetically soft screws 7, 8, 9, and 10 extend through the printed circuit board 39, the armature block 4, and the spacer 5 to decouple the interactive fields between the permanent armature magnets 1, 2, and 3, which eliminate the detrimental effect of the interactive fields upon switching action. The magnetically soft plate or yoke 6, consisting of any magnetically soft material such as iron, acts as an integrated spring magnet for a more economical use of materials. A coaxial cable or transmission line 11 is shown which connects to the high security switch circuit board 39 such that the center conductor of the transmission connects to the black box 49 of the circuit board as shown in FIG. 8A, and the outer conductor or shield connects to the ground plane 52 of the circuit board as shown in FIG. 8B. This high security switch is wired, but not limited to, single pole single throw (SPST) as shown in FIG. 9. The entire assembly may be fastened together by suitable means and in combination with appropriate materials may produce a hermetically sealed unit.

Referring to FIGS. 8A and 8B, a front view and a back view of the circuit board 39 in FIGS. 7A and 7B, respectively, the gaps in the three set of traces 41 and 42, 42 and 43, and 43 and 44, are shorted out by the armature magnets 1, 2, and 3, respectively, when actuated by the actuator assembly. There are four holes through the circuit board substrate 40, made for example from epoxy glass, Teflon, ceramic, or other suitable material, to accommodate the magnetic field decouplers. The first black box 49 consists of the decoupling elements a capacitor, C2, and an RF choke, L2. The capacitor, C2, decouples direct current voltage from the Jackson Security Switch and passes radio frequency signals. The RF choke, L2, decouples radio frequencies from the oscillator power input and passes direct current voltage. The second black box 50 is a radio frequency oscillator, designated as OSC in FIG. 9.

FIG. 9 shows another preferred embodiment of the invention in which a direct current voltage, designated VOLTAGE DC, is passed through an RF choke, L1, down the transmission line and through the RF choke, L2, into the power input of the oscillator. The oscillator may originate single or multiple radio frequencies that are sent through the Jackson Switch system, back down the transmission line, through the decoupling capacitor, C1, and into the decoder. Multiple frequencies can be used as device identification. The electrically grounded box surrounding the switch assembly is an electrically conductive housing grounded to the transmission line's outer conductor. If the transmission line is cut into or tampered with, the system will no longer be matched and will exhibit a VSWR of much greater than 1.5:1 which is communicated to the ELECTRONIC SECURITY SYSTEM by the DECODER as a fault. In this embodiment, the DECODER can monitor one or more of the multiple frequencies. If the security switch is cut from the cable and a dummy resistive matched load is connected thereto, the coded radio frequencies will not be present, which is also communicated to the ELECTRONIC SECURITY SYSTEM as a fault.

Figure 10:
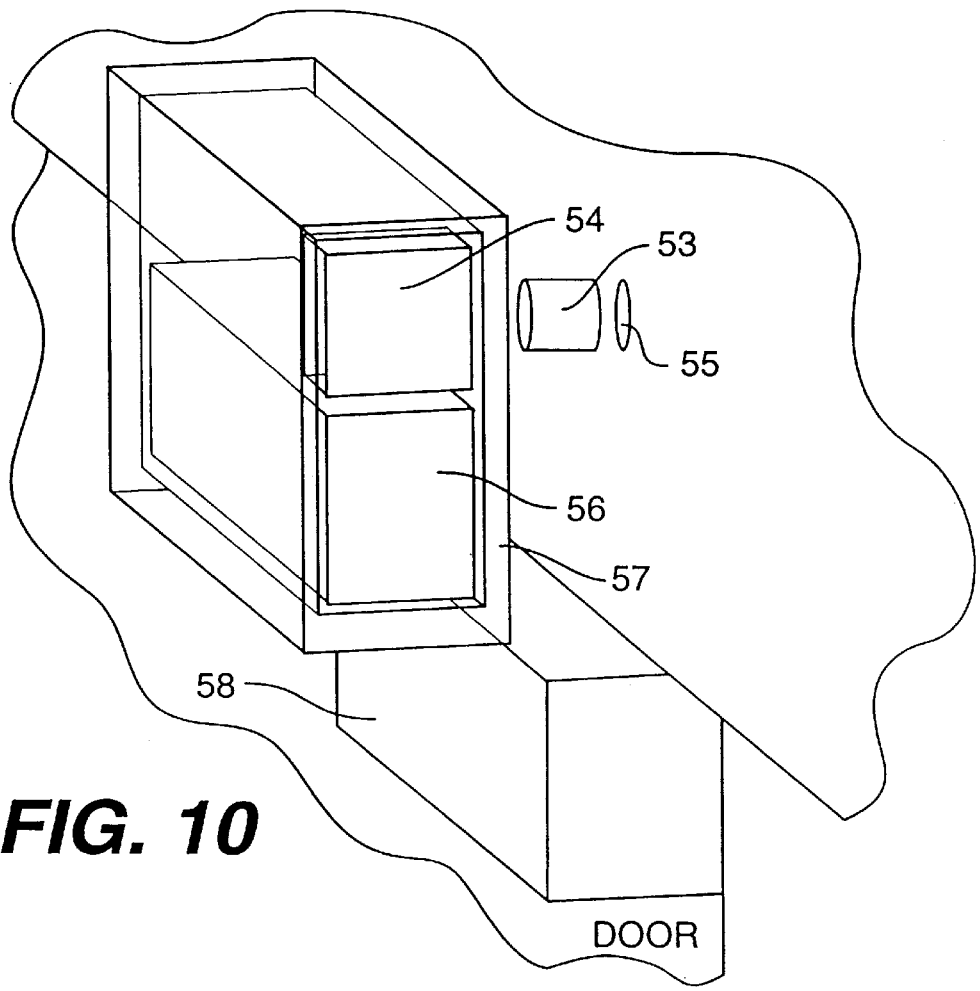
FIG. 10 shows a three dimensional view of a typical security switch in combination with a tamper switch and its actuator and shows the mounting method.
Figure 11:
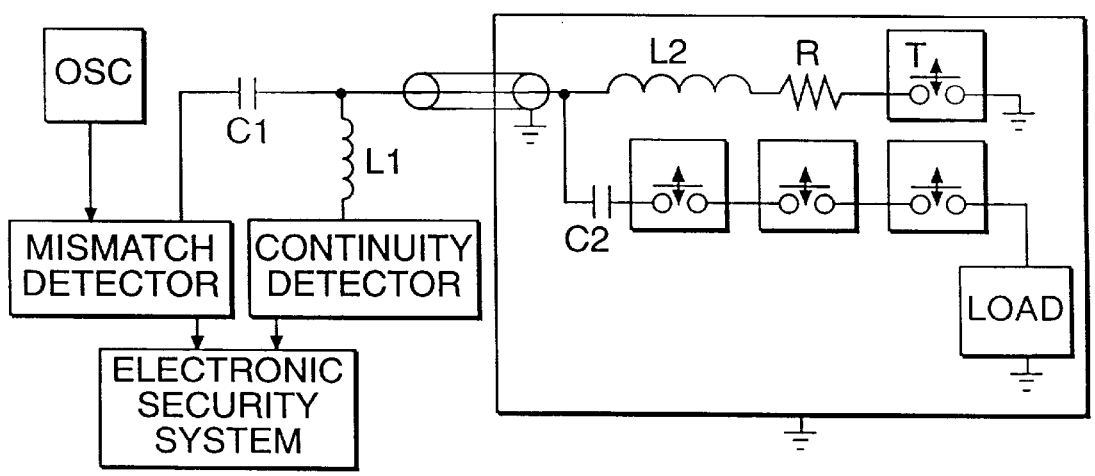
FIG. 11 shows one possible generalized electrical schematic for FIG. 10 of a Jackson Switch system in combination with a Jackson Switch used as a tamper switch, with the radio frequency signal and the direct current voltage decoupled, and in combination with a physical security monitoring system.
Figure 12:
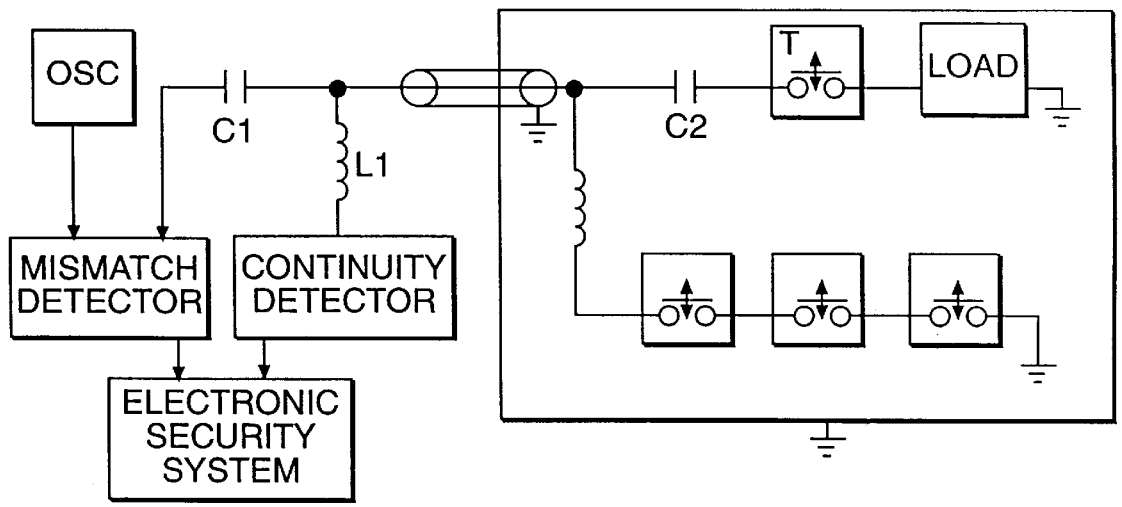
FIG. 12 shows another possible generalized electrical schematic for FIG. 10 of a security switch in combination with a Jackson Switch used as a tamper switch, with the radio frequency signal and the direct current voltage decoupled, and in combination with a physical security monitoring system.

Referring to FIG. 10, a perspective view of a Jackson Switch system in combination with a tamper switch (Jackson Switch) and its actuator and the mounting method are shown, for which two possible electrical schematic variations are shown in FIG. 11 and FIG. 12. The Jackson Switch system 56 and the tamper switch 54 are shown enclosed in a housing 57 that is pulled away from the door frame or wall revealing the tamper switch actuator magnet 53 and its mounting hole 55 in the door frame or wall. The Jackson Switch system actuator 58 is shown in its appropriate position attached to the partially open door. If the switch housing is removed from the door frame or wall a fault condition results when the tamper switch opens.

FIG. 11 shows another preferred embodiment of the invention comprising a radio frequency oscillator, designated OSC, which sends a radio frequency signal through the MISMATCH DETECTOR, through the decoupling capacitor, C1, and down the transmission line, is shown. The radio frequency signal continues to travel through the decoupling capacitor, C2, and through the Jackson Switch system when actuated, shown by the three switch icons, and terminates in the LOAD. The electrically grounded box surrounding the switch assembly is an electrically conductive housing grounded to the transmission line's outer conductor. When the oscillator, MISMATCH DETECTOR, transmission line, Jackson Switch system, and LOAD are substantially matched, there will be minimal reflection of the radio frequency signal. The MISMATCH DETECTOR may be a VSWR (voltage standing wave ratio) circuit which reads a VSWR of 1.5:1 or better when the matched condition exists. If the transmission line is cut into or tampered with, the system will no longer be matched and will exhibit a VSWR of much greater than 1.5:1, which is communicated to the ELECTRONIC SECURITY SYSTEM as a fault. Alternatively, the combination of the oscillator and MISMATCH DETECTOR may be a network analyzer or any other suitable circuit.

A direct current voltage is generated by the CONTINUITY DETECTOR and sent through the decoupling RF choke, L1, down the transmission line, through the decoupling RF choke, L2, and the resistor, R, terminating with the tamper switch (Jackson Switch) marked T in the icon. Interruption of the direct current is detected by the CONTINUITY DETECTOR when the tamper switch opens, which is communicated to the ELECTRONIC SECURITY SYSTEM as a fault.

FIG. 12 shows another preferred embodiment of the invention comprising a radio frequency oscillator, designated OSC, which sends a radio frequency signal through the MISMATCH DETECTOR, through the decoupling capacitor, C1, and down the transmission line, is shown. The radio frequency signal continues to travel through the decoupling capacitor, C2, and through the tamper switch (Jackson Switch) when actuated, shown by the icon marked T, and terminates in the LOAD. The electrically grounded box surrounding the switch assembly is an electrically conductive housing grounded to the transmission line's outer conductor. When the oscillator, MISMATCH DETECTOR, transmission line, Jackson Switch, and LOAD are substantially matched, there will be minimal reflection of the radio frequency signal. The MISMATCH DETECTOR may be a VSWR (voltage standing wave ratio) circuit which reads a VSWR of 1.5:1 or better when the matched condition exists. If the transmission line is cut into or tampered with, the system will no longer be matched and will exhibit a VSWR of much greater than 1.5:1, which is communicated to the ELECTRONIC SECURITY SYSTEM as a fault. Alternatively, the combination of the oscillator and MISMATCH DETECTOR may be a network analyzer or any other suitable circuit.

Figure 13:
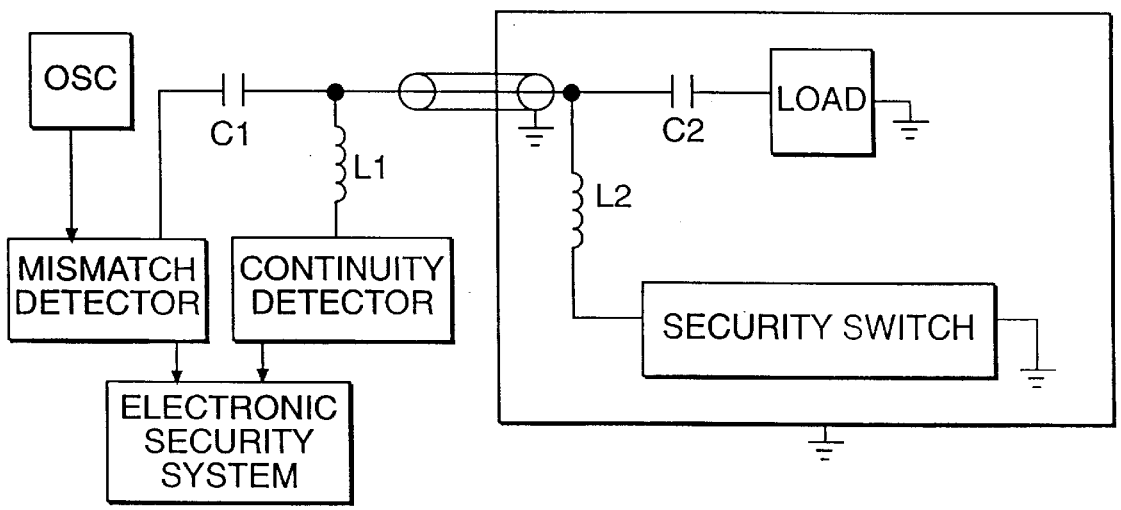
FIG. 13 shows a possible generalized electrical schematic of a security switch with the radio frequency signal and the direct current voltage decoupled, and in combination with a physical security monitoring system.

A direct current voltage is generated by the CONTINUITY DETECTOR and sent through the decoupling RF choke, L1, down the transmission line, through the decoupling RF choke, L2, terminating with the Jackson Switch system shown symbolically by the three switch icons. Interruption of the direct current is detected by the CONTINUITY DETECTOR when the security switch opens which is communicated to the ELECTRONIC SECURITY SYSTEM as a fault. FIG. 13 shows another preferred embodiment of the invention comprising a radio frequency oscillator, designated OSC, which sends a radio frequency signal through the MISMATCH DETECTOR, through the decoupling capacitor, C1, and down the transmission line, is shown. The radio frequency signal continues to travel through the decoupling capacitor, C2, and terminates in the LOAD. The electrically grounded box surrounding the switch assembly is an electrically conductive housing grounded to the transmission line outer conductor. When the oscillator, MISMATCH DETECTOR, transmission line, and LOAD are substantially matched, there will be minimal reflection of the radio frequency signal. The MISMATCH DETECTOR may be a VSWR (voltage standing wave ratio) circuit which reads a VSWR of 1.5:1 or better when the matched condition exists. If the transmission line is cut into or tampered with, the system will no longer be matched and will exhibit a VSWR of much greater than 1.5:1 which is communicated to the ELECTRONIC SECURITY SYSTEM as a fault. Alternatively, the combination of the oscillator and MISMATCH DETECTOR may be a network analyzer or any other suitable circuit.

A direct current voltage is generated by the CONTINUITY DETECTOR and sent through the decoupling RF choke, L1, down the transmission line, through the decoupling RF choke, L2, terminating with any security switch shown symbolically as SECURITY SWITCH. Interruption of the direct current is detected by the CONTINUITY DETECTOR when the switch opens and is communicated to the ELECTRONIC SECURITY SYSTEM as a fault.

Figure 14:
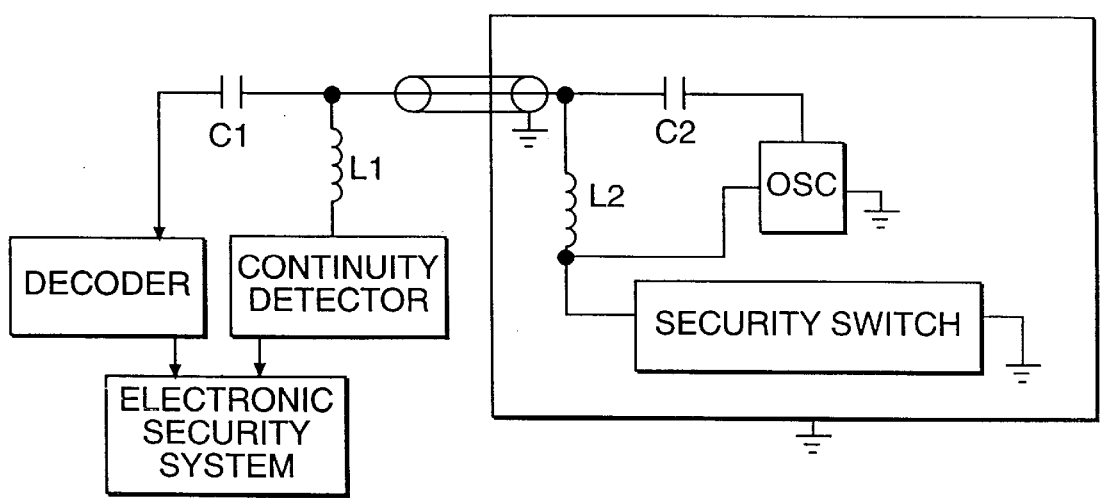
FIG. 14 shows another possible generalized electrical schematic of a security switch with the radio frequency signal and the direct current voltage decoupled, and in combination with a physical security monitoring system.

FIG. 14 shows another preferred embodiment of the invention in which a direct current voltage, designated VOLTAGE DC, is passed through an RF choke, L1, down the transmission line and through the RF choke, L2, into the power input of the oscillator designated OSC, as shown. The oscillator may generate single or multiple radio frequencies that are sent through the decoupling capacitor, C2 and back down the transmission line, through the decoupling capacitor, C1, and into the decoder. Multiple frequencies can be used as device identification. If the transmission line is cut into or tampered with, the system will no longer be matched and will exhibit a VSWR of much greater than 1.5:1, which is communicated to the ELECTRONIC SECURITY SYSTEM by the DECODER as a fault. The electrically grounded box surrounding the switch assembly is an electrically conductive housing which is grounded to the transmission line outer conductor. If the security switch is cut from the cable and a dummy resistive matched load is connected thereto, the coded radio frequencies will not be present, which is also communicated to the ELECTRONIC SECURITY SYSTEM as a fault.

The direct current voltage generated by the CONTINUITY DETECTOR and sent through the decoupling RF choke, L1, down the transmission line, through the decoupling RF choke, L2, also terminates with any security switch shown symbolically as SECURITY SWITCH. Interruption of the direct current is detected by the CONTINUITY DETECTOR when the switch opens and is communicated to the ELECTRONIC SECURITY SYSTEM as a fault.

It will be apparent to those skilled in the art that various modifications and variations can be made in the monitored security switch assembly of the present invention without departing from the spirit or scope of the invention. Thus, it is intended that the present invention cover the modifications and variations of this invention provided they come within the scope of the appended claims and their equivalents.

What is claimed is:

1. A monitored security switch assembly, comprising:
   a switching system including a first impedance, the switching system responsive to a security condition of an object to be protected to switchably alter the value of the first impedance;
   a transmission line, the switching system being impedance matched with the transmission line; and
   a monitoring system which provides at least one oscillatory voltage to the switching system through the transmission line, the monitoring system detecting an impedance mismatch between the switching system and the transmission line due to the security condition, or tampering or cutting of the transmission line.

2. The monitored security switch assembly according to claim 1, wherein the at least one oscillatory voltage includes a radio frequency oscillatory voltage.

3. The monitored security switch assembly according to claim 1, wherein the monitoring system includes an oscillator and a mismatch detector.

4. The monitored security switch assembly according to claim 1, wherein the monitoring system includes a voltage controlled oscillator and a mismatch detector.

5. The monitored security switch assembly according to claim 1, wherein the monitoring system includes a network analyzer.

6. The monitored security switch assembly according to claim 1, wherein the monitoring system determines whether a reflected oscillatory voltage is received from the switching system.

7. The monitored security assembly according to claim 1, wherein the switching system includes a tamper switch, and the monitoring system includes a continuity detector to provide a direct current voltage to the tamper switch.

8. The monitored security switch assembly according to claim 1, wherein the monitoring system includes a continuity detector to provide a direct current voltage to the switching system, the continuity detector detecting an interruption of the direct current voltage.

9. The monitored security switch assembly according to claim 1, wherein the switching system includes a tamper switch, and the oscillatory voltage being provided through the tamper switch.

10. The monitored security switch assembly according to claim 1, wherein the switching system further includes a bandpass filter, wherein the monitoring system provides at least two oscillatory voltages, at least one of the oscillatory voltages having a frequency within a pass band of the bandpass filter.

11. The monitored security switch assembly according to claim 10, wherein the at least one oscillatory voltage includes a radio frequency oscillatory voltage.

12. The monitored security switch assembly according to claim 11, wherein the monitoring system includes an oscillator and a mismatch detector.

13. The monitored security switch assembly according to claim 12, wherein the oscillator is a voltage controlled oscillator.

14. The monitored security switch assembly according to claim 13, wherein the monitoring system determines whether a reflected oscillatory voltage is received from the switching system.

15. The monitored security switch assembly according to claim 14, wherein the switching system includes a tamper switch, and the monitoring system includes a continuity detector to provide a direct current voltage to the tamper switch.

16. A monitored security switch assembly, comprising:
    a transmission line;
    a switching system coupled to the transmission line and including an oscillator which provides at least one oscillatory voltage for transmission over the transmission line, the switching system responsive to a security condition of an object to be protected to disconnect the at least one oscillatory voltage from the transmission line; and
    a monitoring system which receives and detects the at least one oscillatory voltage from the switching system through the transmission line, wherein the monitoring system is impedance matched with the transmission line, the monitoring system monitoring whether the monitoring system and the transmission line are impedance matched due to the security condition or to detect tampering or cutting of the transmission line.

17. The monitored security switch assembly according to claim 16, wherein the at least one oscillatory voltage includes a radio frequency oscillatory voltage.

18. The monitored security switch assembly according to claim 16, wherein the oscillator includes a voltage controlled oscillator.

19. The monitored security switch assembly according to claim 16, wherein the monitoring system determines whether a voltage standing wave ratio is changed.

20. The monitored security switch assembly according to claim 16, wherein the monitoring system includes a continuity detector for providing a direct current voltage to the switching system and detecting an interruption of the direct current voltage.

21. The monitored security switch assembly according to claim 16, wherein the monitoring system provides a direct current voltage to the switching system.

22. The monitored security switch assembly according to claim 21, wherein the switching system includes decoupling elements to decouple the oscillatory voltage and the direct current voltage.

23. The monitored security switch assembly according to claim 22, wherein the decoupling elements include a capacitor and a choke.

24. The monitored security switch assembly according to claim 23, wherein the at least one oscillatory voltage includes a radio frequency oscillatory voltage.

25. The monitored security switch assembly according to claim 24, wherein the oscillator includes a voltage controlled oscillator.

26. A monitoring system for a security switch assembly, comprising:

an oscillator for providing an oscillatory voltage to a transmission line and a switching system having a first impedance, wherein the switching system is responsive to a security condition of an object to be protected to switchably alter the first impedance, and wherein the transmission line is impedance matched with each of the oscillator and the switching system; and a mismatch detector connected to the transmission line and impedance matched with the transmission line, wherein the mismatch detector detects whether an impedance mismatch occurs due to the security condition, or tampering or cutting of the transmission line.

27. The monitoring system according to claim 26, wherein the oscillatory voltage includes a radio frequency oscillatory voltage.

28. The monitoring system according to claim 27, wherein the oscillator is a voltage controlled oscillator.

29. The monitoring system according to claim 28, wherein the mismatch detector determines whether a reflected oscillatory voltage is received from the transmission line.

30. The monitoring system according to claim 28, wherein the mismatch detector determines whether a voltage standing wave ratio is changed.

* * * * *